(12) United States Patent
Chang

(10) Patent No.: US 12,451,890 B2
(45) Date of Patent: Oct. 21, 2025

(54) POWER DOWN CIRCUIT AND POWER DOWN METHOD

(71) Applicant: NANYA TECHNOLOGY CORPORATION, New Taipei (TW)

(72) Inventor: Chih-Hang Chang, Hsinchu (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 305 days.

(21) Appl. No.: 18/188,427

(22) Filed: Mar. 22, 2023

(65) Prior Publication Data
US 2024/0322684 A1 Sep. 26, 2024

(51) Int. Cl.
H03K 17/22 (2006.01)
H03L 5/02 (2006.01)

(52) U.S. Cl.
CPC .............. H03L 5/02 (2013.01); H03K 17/223 (2013.01)

(58) Field of Classification Search
CPC ......... H03K 17/22; H03K 17/223; H03L 5/02
USPC .................................................. 327/142, 143
See application file for complete search history.

(56) References Cited

U.S. PATENT DOCUMENTS

| 4,581,544 A * | 4/1986 | Feldman | H03K 5/04 327/227 |
| 2010/0156520 A1* | 6/2010 | Kume | G05F 1/56 327/540 |
| 2011/0141776 A1* | 6/2011 | Lin | H02M 1/32 363/53 |
| 2018/0198363 A1 | 7/2018 | Watanabe | |
| 2021/0036600 A1 | 2/2021 | Xie et al. | |

FOREIGN PATENT DOCUMENTS

| CN | 109742839 | 5/2019 |
| CN | 210269975 U | 4/2020 |
| CN | 115498634 | 12/2022 |
| TW | 201029288 | 8/2010 |
| TW | 202131129 | 8/2021 |

OTHER PUBLICATIONS

"Office Action of Taiwan Counterpart Application", issued on May 3, 2024, p. 1-p. 7.
"Office Action of China Counterpart Application", issued on Sep. 1, 2025, p. 1-p. 6.

* cited by examiner

Primary Examiner — William Hernandez
(74) Attorney, Agent, or Firm — JCIPRNET

(57) ABSTRACT

A power down circuit and a power down method are provided. The power down circuit includes a holding circuit and a comparator. The holding circuit is coupled to receive a first power signal. The holding circuit is configured to hold the first power signal to generate a second power signal. The comparator is coupled to the holding circuit. The comparator is configured to compare the first power signal and the second power signal to determine whether the first power signal is dropped to be lower than a first threshold voltage.

9 Claims, 4 Drawing Sheets

POWER DOWN CIRCUIT AND POWER DOWN METHOD

BACKGROUND

1. Technical Field

The disclosure generally relates to a circuit and a method, in particular, to a power down circuit and a power down method.

2. Description of Related Art

In various applications, a sensing circuit for detecting power down inside an electronic device is required because a power down sequence should be performed accordingly. More particularly, it usually takes a certain period of time for executing the power down sequence, so the power down circuit should be able to be work for the certain period of time under the power down environment to ensure that the power down sequence can be completed. Further, this power down sequence can also ensure the data and settings stored in the system to settle before another reboot. Therefore, a stable power down circuit is crucial in many applications.

SUMMARY

Accordingly, the disclosure is directed to a power circuit and a power method for providing a stable power down signal.

The power down circuit of the disclosure includes a holding circuit and a comparator. The holding circuit is coupled to receive a first power signal. The holding circuit is configured to hold the first power signal to generate a second power signal. The comparator is coupled to the holding circuit. The comparator is configured to compare the first power signal and the second power signal to determine whether the first power signal is dropped to be lower than a first threshold voltage.

The power down method of the disclosure includes holding a first power signal to generate a second power signal; and comparing the first power signal and the second power signal to generate a comparison result on determining whether the first power signal is dropped to be lower than a first threshold voltage.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
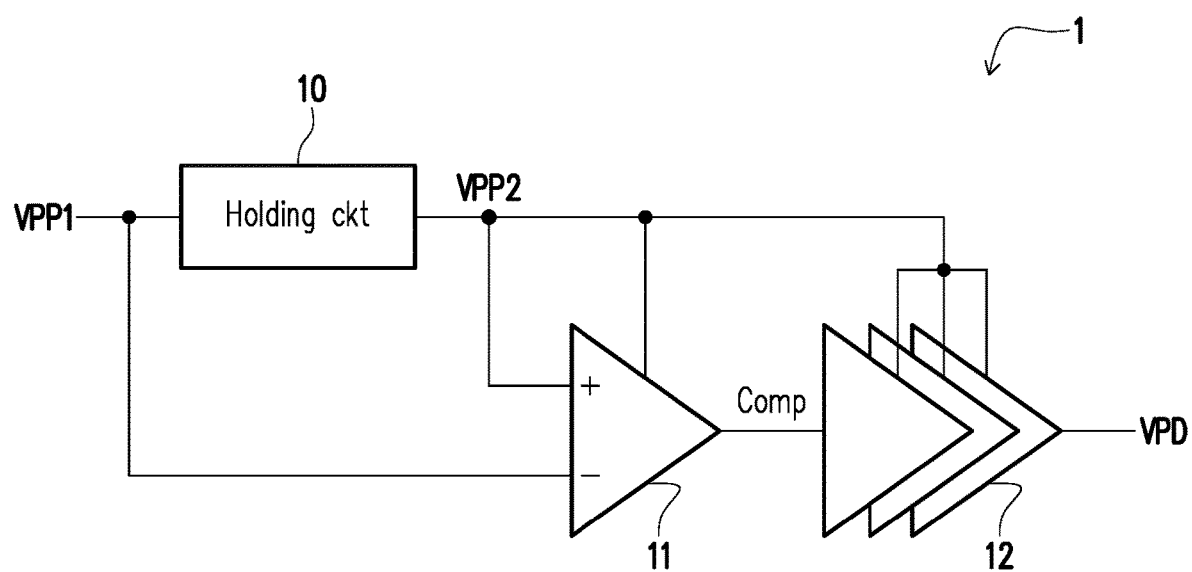
FIG. 1 illustrates a block diagram of a power down circuit 1 according to some embodiments of the present disclosure.

FIG. 1 illustrates a block diagram of a power down circuit 1 according to some embodiments of the present disclosure. The power down circuit 1 may be applied in an electronic device that is driven by a first power signal VPP1. When the electronic device is powered down, electric power for driving the electronic device will be cut out causing the first power signal VPP1 to drop. The power down circuit 1 is utilized for sensing whether the first power voltage VPP1 is powered down, and to generate a power down signal VPD accordingly to inform necessary circuit components inside the electronic device such information. Therefore, when it is detected by the power down circuit 1 that the first power signal VPP1 is lower than a first predetermined voltage, the power down signal VPD may be accordingly switched to an enabled voltage level and maintained for a predetermined time length, such that a power down sequence may be performed to the electronic device driven by the first power voltage VPP1 according to the power down signal VPD. In some embodiments, the power down circuit 1 is configured to maintain the power down signal VPD greater than or equal to an enabled voltage level for a predetermined time length, ensuring that the power down sequence may completed within such period of time.

The power down circuit 1 includes a holding circuit 10, a comparator 11, and a buffer circuit 12. The holding circuit 10 is coupled to receive the first power signal VPP1. The holding circuit 10 is configured to hold and store the first power signal VPP1 and output the stored first power signal VPP1 as a second power signal VPP2. In some embodiments, the holding circuit 10 is configured to hold the second power signal above a second threshold voltage for the predetermined time length after the first power down signal VPP1 is dropped to be lower than a first threshold voltage. In other words, the holding circuit 10 is capable of storing the first power voltage VPP1 for the predetermined time length to delay and slow down a falling speed of the outputted second power voltage VPP2.

The comparator 11 is coupled to the holding circuit 11. The comparator 11 is configured to compare the first power voltage VPP1 and the second power voltage VPP2 to generate a comparison result Comp. Specifically, the first power voltage VPP1 and the second power voltage VPP2 are respectively provided to a negative input end and a positive input end of the comparator. Therefore, when the first power voltage VPP1 is dropped to be lower than the first threshold voltage, the comparator 11 may generate the comparison result Comp at an enabled voltage level. More particularly, the comparator is driven by the second power voltage VPP2 rather than the first power voltage VPP1, so when it is determined, by the comparator 11, that the first power voltage VPP1 is lower than the first threshold voltage, the second power voltage VPP2 is provided at an output end of the comparator 11 as the comparison result Comp.

The buffer circuit 12 is coupled to the comparator 11. The buffer circuit 12 is configured to buffer the comparison result Comp to generate power down signal VPD. The buffer circuit 12 is driven by the second power signal VPP2, so when the first power voltage VPP1 is dropped to be lower than the first threshold voltage, the buffer circuit 12 may output the second power voltage VPP2 at an output end of the buffer circuit 12.

In operation, when the electronic device of which the power down circuit disposed is powered down and the electric power for driving the first power voltage VPP1 is cut, the first power voltage VPP1 is dropped rapidly. In order to ensure that there is enough time for the electronic device to execute the power down sequence, the power down circuit 1 stores energy from the first power voltage VPP1, so the falling speed of the second power voltage VPP2 may be slowed down by the holding circuit 10 and the generated second power voltage VPP2 has a gentler declination which is kept above the second threshold voltage for the predetermined time length. When the comparator 11 senses that the first power signal VPP1 is less than the second power signal VPP2, the comparator 11 may switch the comparison result CR to the enabled voltage level by providing the second power signal VPP2 at the output end. At last, when the buffer circuit 12 senses that the comparison result CR is increased to be greater than a threshold voltage of the buffer circuit 12, the buffer circuit 12 controls the power down signal VPD to change from low to high by providing the second power signal VPP2 as the power down signal VPD as well.

Overall, the power down circuit 1 stores charge and energy of the first power down signal VPP1, such that the power down circuit 1 may generate the second power signal VPP2 which has a slower and gentler declination when the first power signal VPP1 is dropped. Then, the comparator 11 uses the stored second power signal VPP2 as a reference rather than a fixed reference voltage in the comparison with the first power voltage VPP1. That avoids the comparator 11 from generating the erroneous comparison result CR due to the fact that the fixed reference voltage might by affected by the power down. Further, since the comparator 11 and the buffer circuit 12 are driven by the second power signal VPP2 which is still kept high for the predetermined time length when the first power signal VPP1 is down, this provides a more stable power condition for the power down circuit 1 such that the generated down signal VPD has a stronger driving force when the first power signal VPP1 is already down.

Figure 2:
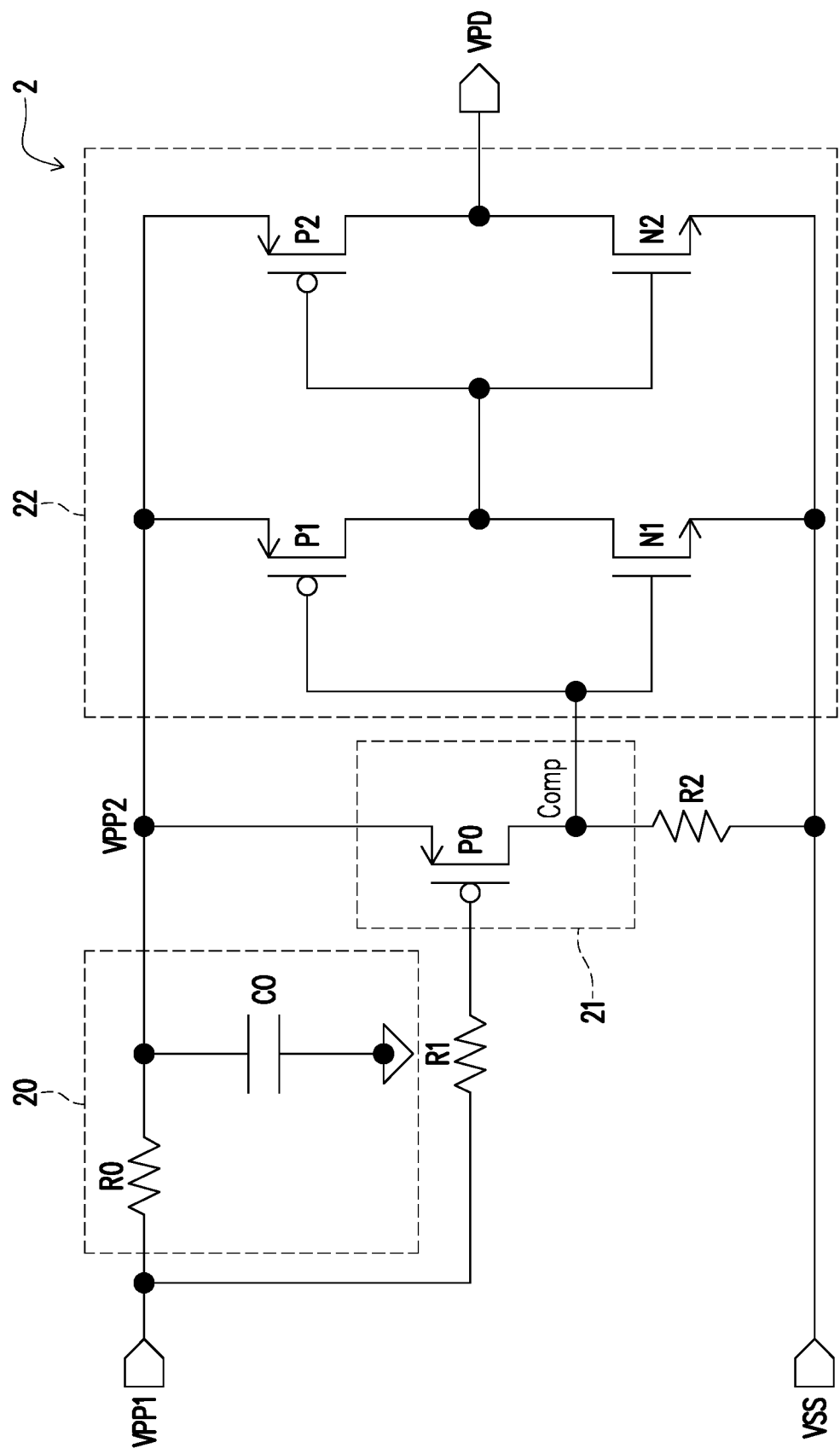
FIG. 2 illustrates a schematic of a power down circuit 2 according to some embodiments of the present disclosure.

FIG. 2 illustrates a schematic of a power down circuit 2 according to some embodiments of the present disclosure. The power down circuit 2 includes a holding circuit 20, a comparator 21, and a buffer circuit 22.

The holding circuit 20 is coupled to receive a first power signal VPP1, and configured to hold the first power signal VPP1 to generate a second power signal VPP2. In such embodiment, the holding circuit 20 includes a resistor R0 and a capacitor C0. The resistor R0 has a first end coupled to receive the first power signal VPP1 and a second end coupled to an output end of the holding circuit 20. The capacitor C0 has a first end coupled to the second end of the resistor R0, and a second end coupled to a reference ground voltage VSS. The second power signal VPP2 is generated at a node between the resistor R0 and the capacitor C0. More particularly, the holding circuit 20 stores the charge of the first power voltage VPP1 on the capacitor C0 through the resistor R0. The resistor R0 ensures a lower discharge current from the capacitor C0 when the first power voltage VPP1 is dropped rapidly, thereby preserving the second power voltage VPP2 on the top plate of the capacitor C0 a slower declination.

The comparator 21 includes a transistor P0. In such embodiment, the transistor P0 is a p-type transistor with a source being coupled to receive the second power signal VPP2, a drain being coupled to a reference ground voltage VSS through a resistor R2, and a gate coupled to the first power voltage VPP1 through a resistor R1. The transistor P0 is configured to compare voltages received at its gate and source. When the gate voltage is lower than the source by a threshold voltage of the transistor P0, the transistor P0 is turned on (i.e., conductive) by the first and second power voltages VPP1, VPP2, so a current is flowing through the comparator 21 and provided at the drain of the transistor P0.

Thus, the comparison result Comp is generated based on a voltage across the resistor R2 resulted from the current flowing through.

The buffer circuit 22 includes transistors N1, N2, P1, P2. The transistors are coupling as two inverters coupled in series. The comparison result Comp is fed to the inverter chain to generate the power down signal VPD output buffering. Particularly, the buffer circuit 22 is driven by the second power signal VPP2, so when the comparison result Comp shows that the first power voltage VPP1 is less than the first threshold voltage, the second power signal VPP2 may pull up the power down signal VPD to be the same as the second power signal VPP2.

Overall, the power down circuit 2 provides implementations on how the holding circuit 20, the comparator 21, and the buffer circuit 22 are implemented. The power down circuit 2 hold the first power signal VPP1 for generating the second power signal VPP2, and thus provides a more stable power source for the power down circuit 2 when the first power signal VPP1 is already down.

Figure 3:
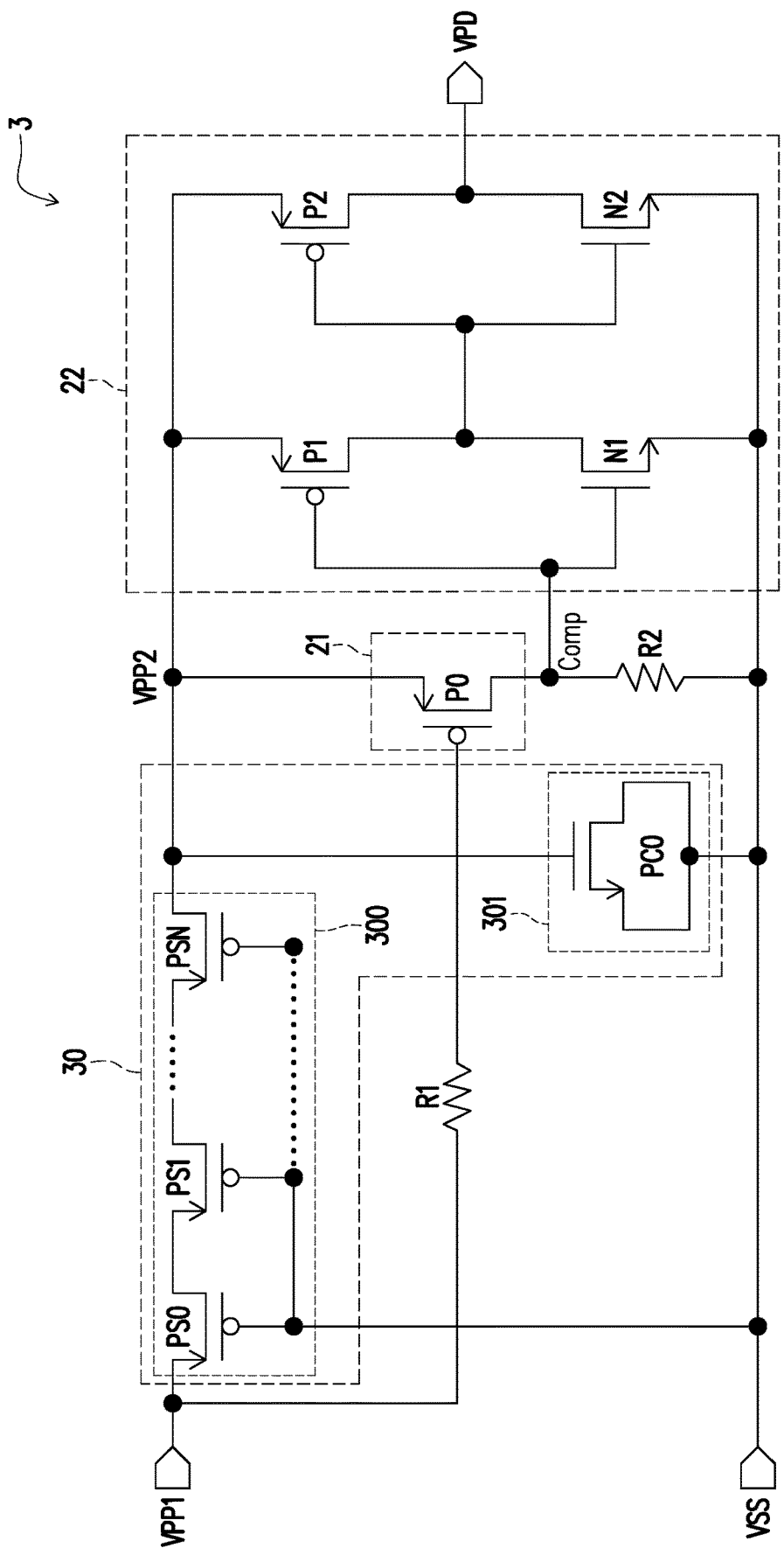
FIG. 3 illustrates a schematic power down circuit 3 according to some embodiments of the present disclosure.

FIG. 3 illustrates a schematic of a power down circuit 3 according to some embodiments of the present disclosure. The power down circuit 3 in FIG. 3 is similar to the power down circuit 2 in FIG. 2 except that the holding circuit 20 in the power down circuit 2 is replaced by a hold circuit 30 in FIG. 3, so the same circuit components are labeled by the same symbols.

The holding circuit 30 includes an active resistor 300 and an active capacitor 301. The active resistor 300 includes a plurality of transistors PS0-PSN coupled in series. All gates of the transistors PS0-PSN are coupled to receive the reference ground voltage VSS, so the transistors PS0-PSN are all biased the fixed reference ground voltage VSS to function equivalently as a resistor. On the other hand, the active capacitor 301 includes a transistor PC0 coupled between the active resistor 300 and the reference ground voltage VSS. A gate of the transistor PC0 is coupled to the active resistor 300, and source and drain of the transistor PC0 are coupled to the reference ground voltage VSS, so the transistor PC0 is functioning as a capacitor between the active resistor 300 and the reference ground voltage VSS.

Overall, the power down circuit 3 provides implementations on how the holding circuit 30 is realized active devices. By using the active resistor and the active capacitor, the holding circuit 30 can be integrated with other semiconductor devices more easily since they are fabricated by the same manufacturing process.

Figure 4:
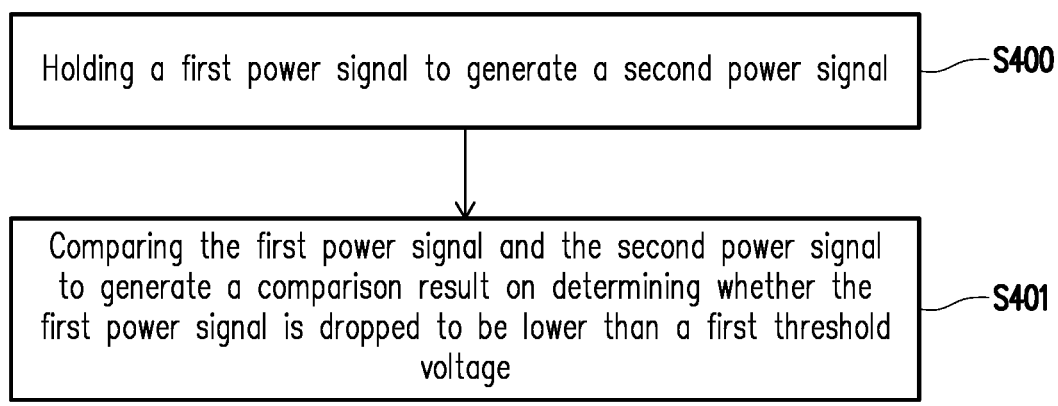
FIG. 4 illustrates a flow chart of a power down method according to some embodiments of the present disclosure.

FIG. 4 illustrates a flow chart of a power down method according to some embodiments of the present disclosure. The power down method may be implemented by anyone of the power down circuits 1, 2, 3, in FIGS. 1, 2, 3. The power down method includes steps S400, S401.

In step S400, a first power signal VPP1 is held to generate a second power signal VPP2. Particularly, the first power signal VPP1 is held by a holding circuit, such that the generated second power signal VPP2 may be greater than a second threshold voltage when the first power voltage VPP1 is dropped to be lower than a first threshold voltage. In other words, the second power signal is maintained at a voltage level higher than the second threshold voltage even if the first power voltage VPP1 is dropped.

In step S401, the first power signal and the second power signal are compared to generate a comparison result based a determination that whether the first power signal is dropped to be lower than a first threshold voltage. Specifically, when the first power voltage VPP1 is dropped, the comparison with the first power voltage VPP1 using the second power voltage VPP2 as the reference is performed, and such configuration ensures a stabler and reliable comparison by preventing the reference to be affected by the power down. As a result, the comparison result CR showing whether the first power voltage VPP1 is down may be generated accordingly.

In operation, when an electronic device is powered down and the electric power for driving the first power voltage VPP1 is cut, the first power voltage VPP1 is dropped rapidly. In order to ensure that there is enough time for the electronic device to execute the power down sequence, the first power voltage VPP1 may be stored by the holding circuit to generate the second power voltage VPP2, such that the falling speed of the second power voltage VPP2 may be slowed down and the generated second power voltage VPP2 may have a gentler declination slope. The first and second voltages VPP1, VPP2 are compared by a comparator to generate the comparison result CR, and then the comparison result CR is fed into a buffer circuit to generate a power down signal. Both the comparator and the buffer circuit are driven by the second power voltage which is kept above the second threshold voltage for the predetermined time length, so the comparator and the power down circuit can be operated using a stronger power source even if the first power signal VPP1 is down.

In summary, the power down circuit and the power down method of various embodiments of the present disclosure store the power signal. Further, the stored power signal is used as a reference to compare with the original power signal to determine whether the power is down. The stored power signal is held high for the predetermined time length which provides a stabler and stronger driving force for the power down circuit and the better time margin to perform the power down sequence.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A power down circuit, comprising:
   a holding circuit coupled to receive a first power signal, the holding circuit being configured to hold the first power signal to generate a second power signal; and
   a comparator coupled to the holding circuit, the comparator being configured to compare the first power signal and the second power signal to generate a comparison result for determining whether the first power signal is dropped to be lower than a first threshold voltage,
   wherein after the first power signal is dropped to be lower than the first threshold voltage, the holding circuit is configured to hold the second power signal to be greater than a second threshold voltage for a predetermined time length.

2. The power down circuit of claim 1, wherein after the first power signal is dropped to be lower than the first threshold voltage, the comparator is configured to take the second power signal as the comparison result.

3. The power down circuit of claim 1, wherein the holding circuit comprising:
   a resistor having a first end coupled to receive the first power signal; and
   a capacitor having a first end coupled to a second end of the resistor, and a second end coupled to a reference ground voltage,
   wherein the second power signal is generated at a node between the resistor and the capacitor.

4. The power down circuit of claim 3, wherein the resistor is an active resistor comprising a plurality of transistors coupled in series between the first power signal and the capacitor, the capacitor is an active capacitor comprising a metal-oxide-silicon transistor capacitor (mos cap).

5. The power down circuit of claim 1, wherein the comparator having a positive input end coupled to receive the second power signal and a negative input end coupled to receive the first power signal to generate the comparison result at an output end.

6. The power down circuit of claim 1, wherein the comparator is a transistor with its source coupled to receive the second power signal, its gate coupled to receive the first power signal, and the comparison result generated at its drain.

7. The power down circuit of claim 1, further comprising a buffer circuit coupled to the comparator, the buffer circuit being driven by the second power signal to generate a power down signal according to the comparison result.

8. A power down method, comprising:
   holding a first power signal to generate a second power signal;
   comparing the first power signal and the second power signal to generate a comparison result on determining whether the first power signal is dropped to be lower than a first threshold voltage; and
   holding the second power signal to be greater than a second threshold voltage for a predetermined time length after the first power signal is dropped to be lower than the first threshold voltage.

9. The power down method of claim 8, further comprising:
   when the first power signal is dropped to be lower than the first threshold voltage, taking the second power signal as the comparison result.

\* \* \* \* \*